United States Patent [19]

Muto et al.

[11] Patent Number: 4,929,984
[45] Date of Patent: May 29, 1990

[54] RESONANT TUNNELLING BARRIER STRUCTURE DEVICE

[75] Inventors: Shunichi Muto; Tsuguo Inata; Atsushi Takeuchi, all of Isehara; Yoshihiro Sugiyama, Atsugi, all of Japan

[73] Assignee: Fujitsu Limited, Kawasaki, Japan

[21] Appl. No.: 265,814

[22] Filed: Nov. 1, 1988

[30] Foreign Application Priority Data

Nov. 10, 1987 [JP] Japan .................. 62-282057

[51] Int. Cl.⁵ .................................. H01L 27/12
[52] U.S. Cl. .................................. 357/4; 357/16; 357/57
[58] Field of Search ............ 357/4 SL, 4, 16, 57

[56] References Cited

U.S. PATENT DOCUMENTS 4,712,121 12/1987 Yokoyama .................. 357/16

OTHER PUBLICATIONS

Morkoc et al., *Appl. Phys. Lett.*, 14 Jul. 1986 pp. 70-72.
Japanese Journal of Applied Physics, vol. 25, No. 12, Dec. 1986, pp. L983-L985, "Excellent Negative Differential Resistance of InAlAs/InGaAs Resonant Tunneling Barrier Structures Grown by MBE", by Tsuguo Inata et al.

*Primary Examiner*—Martin H. Edlow
*Attorney, Agent, or Firm*—Staas & Halsey

[57] ABSTRACT

A resonant tunnelling barrier (RTB) structure device (e.g., diode), having a large peak-to-valley current density (Jp/Jv) ratio, includes an InP substrate and a RTB structure structure. The RTB structure is formed by a first doped layer of InP or $In_{0.53}Ga_{0.47}As$, a first barrier layer of $Al_xGa_{1-x}As_ySb_{1-y}$ ($0 \leq x \leq 1$, $y = 0.51 + 0.05x$), a well layer of InP or $In_zGa_{1-z}As$ ($0.52 \leq z \leq 0.54$), a second barrier layer of the AlGaAsSb, and a second doped layer of InP or $In_zGa_{1-z}As$. The layers of the RTB structure are lattice-matched to InP.

7 Claims, 5 Drawing Sheets

RESONANT TUNNELLING BARRIER STRUCTURE DEVICE

BACKGROUND OF THE INVENTION

1. Field of the Invention

The present invention relates to a compound semiconductor device, and more particularly, to a resonant tunnelling barrier (RTB) structure device having a negative differential resistance characteristic caused by a resonant tunnelling phenomenon in a superlattice structure.

2. Description of the Related Art

The negative differential resistance characteristic is an useful phenomenon which can be applied to a detector or oscillator having an ultrahigh frequency, an ultrahigh speed new functional transistor, and the like (see, for example, T. INATA et al: Excellent Negative Differential Resistance of InAlAs/InGaAs Resonant Tunnelling Barrier Structures Grown by MBE, Jpn. J. Appl. Phys. Vol. 25, No. 12 (1986), pp. 983–985). Resonant tunnelling barrier structure devices such as a resonant tunnelling barrier (RTB) diode, a resonant tunnelling bipolar transistor (RBT), and a resonant tunnelling hot electron transistor (RHET), have been proposed: For example, EP-017734-A2 (corresponding to U.S. Pat. No. 4,712,121) discloses a type of RHET.

When the resonant tunnelling barrier (RTB) structure is used in a semiconductor element (i.e., diode or transistor), the RTB must have high peak current density (Jp) of more than $1 \times 10^5$ A/cm$^2$ and a large peak-to-valley current density (Jp/Jv) ratio of more than 10, but good values of these properties at room temperature can not be obtained as long as the RTB structure is lattice-matched to a semiconductor substrate. The following values were obtained by lattice-matched RTB structure diodes.

Where the RTB structure is made of AlAs/GaAs/AlAs structure (wherein AlAs indicates barrier layers and GaAs indicates a well layer sandwiched between the barrier layers) lattice-matched to a GaAs substrate, $$Jp=4\times 10^4 \text{ A/cm}^2, \; Jp/Jv=3.5.$$

Where the RTB structure is an $In_{0.52}Al_{0.48}As/In_{0.53}Ga_{0.47}As/In_{0.52}Al_{0.48}As$ structure lattice-matched to an InP substrate, $$Jp=4.8\times 10^4 \text{ A/cm}^2, \; Jp/Jv=5.5.$$

In these cases, the Jp/Jv ratios were relatively small, but when a strained layer resonant tunnelling barrier structure is made of AlAs/InGaAs/AlAs (on an InP substrate), which structure does not meet the lattice-matching condition, a high Jp/Jv ratio of 14 was obtained at room temperature. The strained layer RTB structure belongs to the strained layer superlattice structure group, and it is assumed that such a high Jp/Jv ratio is obtained because a difference ($\Delta Ec$) between the conduction band bottoms of AlAs and InGaAs is large (1.2 eV or more), which form high potential barriers. Nevertheless, there is a difference (of about 4%) between the lattice constants of AlAs and InGaAs in the strained layer RTB structure, so that a large lattice strain occurs at the interfaces therebetween and internal stresses occur in each of the AlAs layers and the InGaAs layer. Therefore, when a semiconductor device including the strained layer RTB structure is operated for a long period, problems such as a deterioration of the interfaces and disappearance of a valley peak, can occur. Namely, the device tends to have a short service life.

The coinventors (T. Inata and S. Muto) of the present application proposed a resonant tunnelling semiconductor device including an RTB structure comprising first and second barriers of $(In_{0.52}Al_{0.48}As)_z(In_{0.53}Ga_{0.47}As)_{1-z}$, $(0<z\leq 1)$, and a well layer of $In_{1-y}Ga_yAs$, $(0.48\geq y\geq 0.46)$, lattice-matched to an InP substrate (in EP-0256759-A corresponding to U.S. Ser. No. 081,340, now U.S. Pat. No. 4,825,264). In this case the barrier layers are made of a quaternary compound semiconductor InAlGaAs lattice-matched to InP.

SUMMARY OF THE INVENTION

An object of the present invention is to provide an RTB structure device having negative differential resistance characteristics in which a maximum (peak) current density Jp and a maximum/minimum (peak-to-valley) current density (Jp/Jv) ratio are high and lattice-matched to an InP substrate.

The above-mentioned and other objects of the present invention are obtained by providing an RTB structure device comprising: an InP substrate and a RTB structure formed on the InP substrate and consisting of at least two barrier layers of $Al_xGa_{1-x}As_ySb_{1-y}$ ($0\leq X \leq 1$, $y=0.51+0.05x$), at least one well layer of InP or $In_zGa_{1-z}As$ ($0.52\leq z\leq 0.54$) sandwiched between the barrier layers, and two doped layers of InP or $In_zGa_{1-z}As$ holding all of the barrier layers and the well layer therebetween. The barrier layers, well layers, and doped layers are lattice-matched to the InP of the substrate.

The RTB structure can be a single-quantum well structure or a multi-quantum well structure.

When the single-quantum well structure is adopted, the RTB structure device comprises an InP substrate; a first doped layer of InP or $In_zGa_{1-z}As$ ($0.52\leq z\leq 0.54$) formed on the InP substrate and lattice-matched to InP; a first barrier layer of $Al_xGa_{1-x}As_ySb_{1-y}$ ($0\leq x\leq 1$, $y=0.51+0.05x$) formed on the high concentration doped layer and lattice-matched to InP; a well layer of InP or $In_zGa_{1-z}As$ formed on the first barrier layer and lattice-matched to InP; a second barrier layer of $Al_xGa_{1-x}AsxSb_{1-y}$ formed on the well layer and lattice-matched to InP; and a second doped layer of InP or $In_zGa_{1-z}As$ formed on the second barrier layer and lattice-matched to InP.

When the multi-quantum well structure is adopted, the barrier layers and the well layers are stacked one upon the other, as shown in FIGS. 11 and 12 of EP-017734-A2 (U.S. Pat. No. 4,712,121).

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Figure 1:
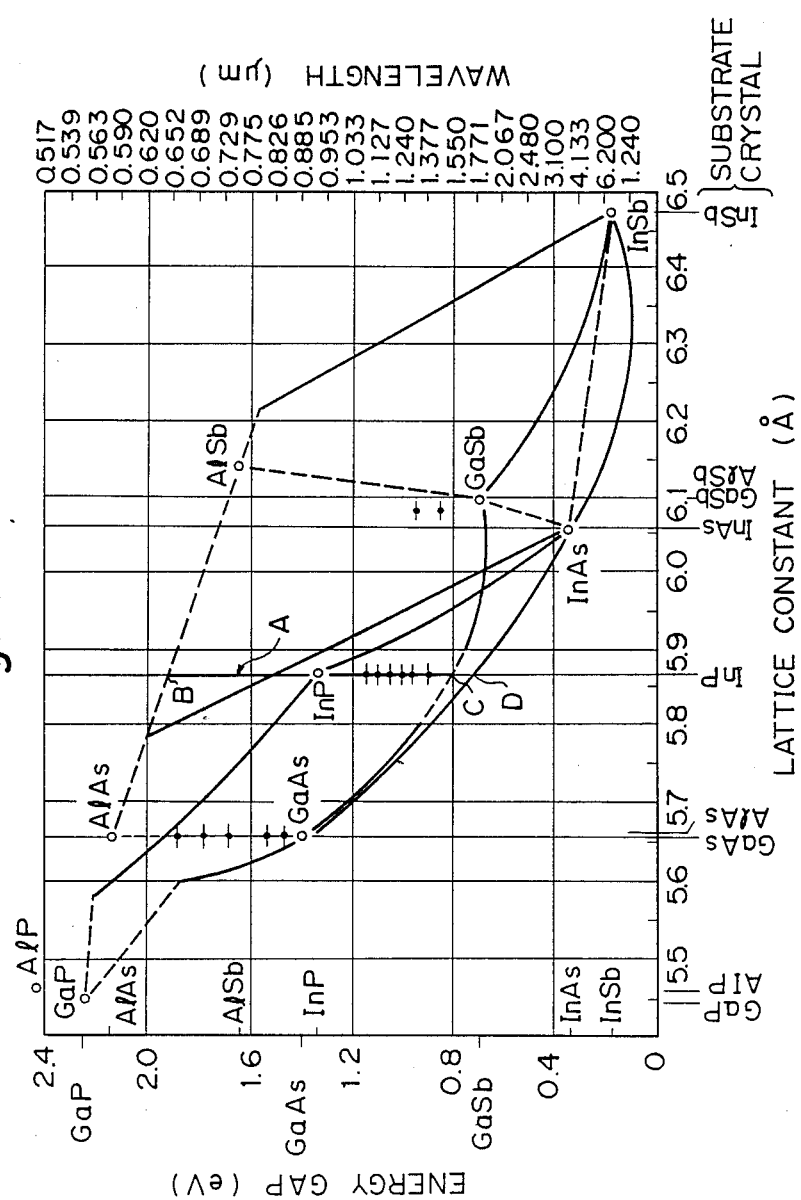
FIG. 1 is a diagram showing the energy gap and lattice constant for III-V compound semiconductors.

Referring to FIG. 1, the $Al_xGa_{1-x}As_ySb_{1-y}$ of the barrier layers of an RTB structure according to the present invention is lattice-matched to the InP of a substrate and is located as shown by a bold solid line A. When the mole fraction "x" is equal to 1, the barrier layer is made of $AlAs_{0.56}Sb_{0.44}$ as indicated at point B in FIG. 1, but when "x" is equal to 0, the barrier layer is made of $GaAs_{0.51}Sb_{0.49}$ as indicated at point C. The $In_zGa_{1-z}As$ indicated at point D is lattice-matched to the InP and there is a range of "z" of from 0.52 to 0.54 depending on the growing methods. The value of "z" of 0.53 is most preferable.

Figure 2:
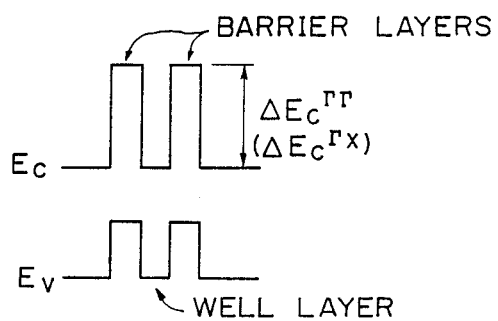
FIG. 2 is a schematic energy band diagram of an RTB structure.

A typical energy band diagram of the RTB structure comprising the barrier layers and a well layer sandwiched therebetween, under a nonbias condition, is illustrated in FIG. 2.

Figure 3A:
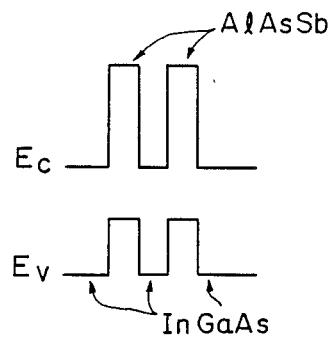
FIG. 3A is a schematic energy band diagram of the RTB structure comprising AlAsSb barrier layers and an InGaAs well layer.
Figure 3B:
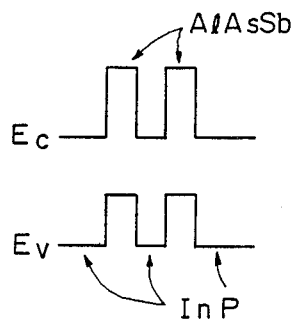
FIG. 3B is a schematic energy band diagram of the RBT structure comprising AlAsSb barrier layers and an InP well layer.

In the combination of the $AlAs_{0.56}Sb_{0.44}$ barrier layers (x=1) and the $In_{0.53}Ga_{0.47}As$ well layer and doped layers, an energy difference ($\Delta Ec^{\Gamma\Gamma}$) between the conduction band bottoms of the AlAsSb (in a direct transition condition) and InGaAs is calculated to be 1.6 eV or more, as shown in FIG. 3A. In the combination of $AlAs_{0.56}Sb_{0.44}$ barrier layers and the InP well layer and doped layers, an energy difference ($\Delta Ec^{\Gamma\Gamma}$) between the conduction band bottoms of the AlAsSb and InP is also calculated to be 1.35 eV or more, as shown in FIG. 3B. But, since the $AlAs_{0.56}Sb_{0.44}$ is an indirect transition type semiconductor, the negative differential resistance characteristics are influenced by the energy difference ($\Delta Ec^{\Gamma X}$) between the conduction band bottoms of the AlAsSb (at an indirect transition condition) and the InGaAs, which is 0.9 eV or more, as shown in FIG. 3A. In the combination of $AlAs_{0.56}Sb_{0.44}$ and InP, an energy difference ($\Delta Ec^{\Gamma\Gamma}$) therebetween is 0.65 eV or more, as shown in FIG. 3B. This energy difference is relatively large.

As the Al content of the $Al_xGa_{1-x}As_ySb_{1-y}$ barrier layers is reduced, i.e., the mole fraction "x" becomes smaller, the energy difference ($\Delta Ec$) between the conduction band bottoms of the barrier layers and the $In_{0.53}Ga_{0.47}As$ or InP layers is decreased, and the Jp/Jv ratio is lowered.

When the mole fraction "x" of the $Al_xGa_{1-x}As_ySb_{1-y}$ becomes 0.35, the AlGaAsSb is changed from a indirect transition type semiconductor to a direct transition type semiconductor. Namely, when "x" is within a range of 0.35 to 1, the AlGaAsSb is an indirect transition type semiconductor, and this range is preferable in view of a barrier height, i.e., the energy difference ($\Delta Ec$) for the Jp/Jv ratio.

Figure 4A:
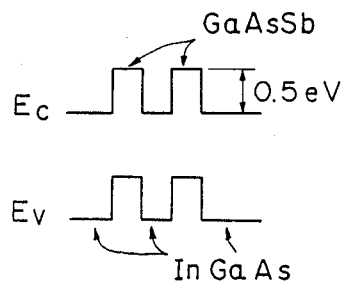
FIG. 4A is a schematic energy band diagram of the RBT structure comprising GaAsSb barrier layers and an InGaAs well layer.
Figure 4B:
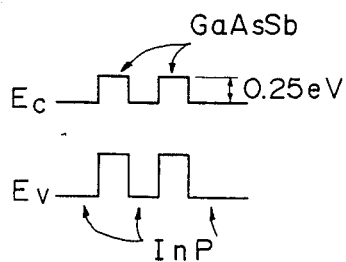
FIG. 4B is a schematic energy band diagram of the RTB structure comprising GaAsSb barrier layers and an InP well layer.

When the mole fraction "x" becomes equal to 0, i.e., the barrier layer is made of $GaAs_{0.51}Sb_{0.49}$ without Al, the energy difference ($\Delta Ec^{\Gamma\Gamma}$) between the conduction band bottoms of the GaAsSb and the $In_{0.53}Ga_{0.47}As$ or InP is about 0.5 eV (FIG. 4A) and about 0.25 eV (FIG. 4B), respectively. These energy differences are relatively small. But, since the GaAsSb is a direct transition type semiconductor device, the RTB structure device comprising the GaAsSb barrier layers has a good negative differential resistance characteristic such as a Jp/Jv ratio of 10 or more at 77K. The Al included in the AlGaAsSb barrier layer has a strong reactivity and is easily contaminated, and thus a disadvantage exists in that large-scale mass-production growth methods, such as the MBE (molecular-beam epitaxy) method using gas sources and the MOCVD (metalorganic chemical vapor deposition) method, are not suitable for an epitaxial growth of the AlGaAsSb layer. But, as the GaAsSb barrier layer does not contain Al, this disadvantage does not exist.

Concerning the epitaxial growth of the quaternary compound semiconductor of $Al_xGa_{1-x}As_ySb_{1-y}$, if a liquid phase epitaxial growth is adopted, AlGaAsSb lattice-matched to InP is not obtained because of a wide miscibility gap in this system. In this case, since the atom size of As is very different from that of Sb, the $Al_xGa_{1-x}As_ySb_{1-y}$ having optional values of "x" and "y" can not be grown. Note, it is possible to epitaxially grow the $Al_xGa_{1-x}As_ySb_{1-y}$ having the desired composition by an MBE method.

An RTB structure device according to the present invention is now explained.

Figure 5:
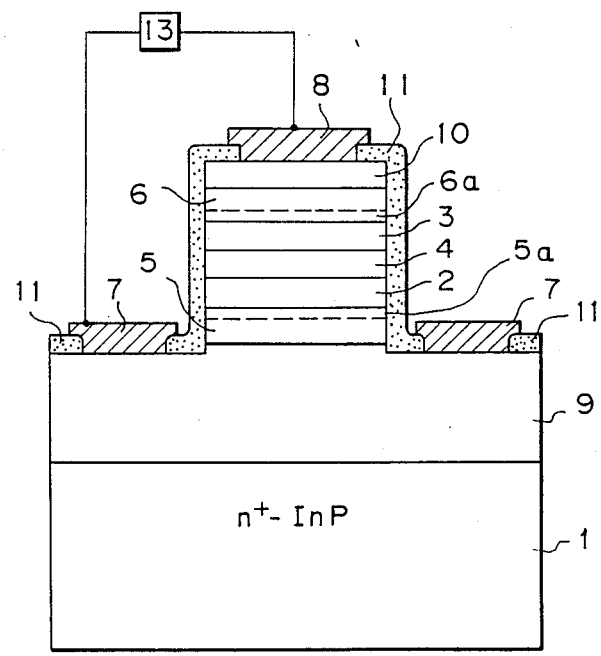
FIG. 5 is a schematic sectional view of an RTB structure device according to the present invention.

Referring to FIG. 5, a diode having an RTB structure according to the present invention comprises an InP substrate 1 and an RTB structure formed on the substrate 1 and consisting of barrier layers 2 and 3 of $Al_xGa_{1-x}As_ySb_{1-y}$ ($0 \leq x \leq 1$, $y = 0.51 + 0.05x$) lattice-matched to InP, a well layer of $In_{0.53}Ga_{0.47}As$ or InP sandwiched between the layers 2 and 3 and doped layers 5 and 6 holding the barrier layers 2 and 3 therebetween. To prevent a diffusion of impurities to the barrier layers 2 and 3 from the doped layers 5 and 6, spacer layers 5a and 6a of undoped $In_{0.53}Ga_{0.47}As$ or InP are formed between the barrier layers and doped layers, respectively. Furthermore, to provide an ohmic contact with metal electrodes 7 and 8, contact layers 9 and 10 of heavily doped $In_{0.53}Ga_{0.47}As$ or InP are formed between the InP substrate 1 and the doped layer 5 and on the doped layer 6, respectively.

The RTB structure diode of FIG. 5 is produced in the following manner.

On the InP substrate 1, the contact layer 9, the doped layer 5, the spacer layer 5a, the barrier layer 2, the well layer 4, the barrier layer 3, the spacer layer 6a, the doped layer 6, and the contact layer 10 are successively epitaxially grown by an MBE method using metal sources, to lattice-match these layers to InP. As shown in FIG. 5, the laminated layers are selectively etched by a suitable etching method, to expose the contact layer 9. The whole exposed surface is covered with a protective layer 11 of, e.g., $SiO_2$, and the layer 11 is selectively etched to open contact holes on the contact layers 9 and 10, respectively. Then the metal electrodes 7 and 8 of, e.g., Au, are formed, to fill the contact holes and to make ohmic contact with the contact layers 9 and 10. The electrodes 7 and 8 are connected to a means 13 for applying a voltage to the diode.

Figure 6:
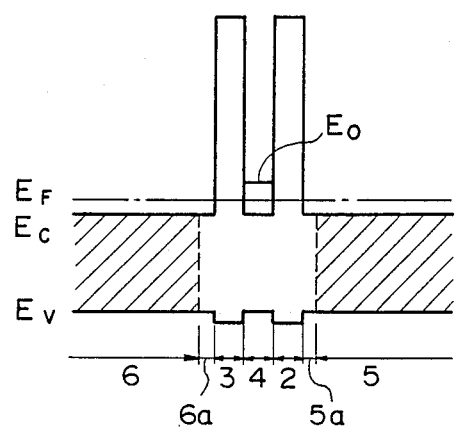
FIG. 6 is a schematic energy band diagram of the RBT structure device of FIG. 5, under a nonbias condition.

FIG. 6 shows a conduction energy-band diagram of the RTB structure diode of FIG. 1 under a nonbias condition (i.e., when no voltage is applied across the metal electrodes 7 and 8). A quantum well of the well layer 4 is sandwiched between two barriers of the barrier layers 2 and 3.

Figure 7:
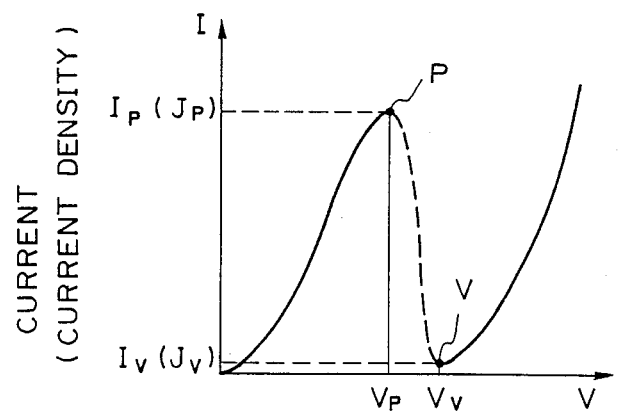
FIG. 7 is a current-voltage characteristic diagram of the RTB structure device of FIG. 5.
Figure 8A:
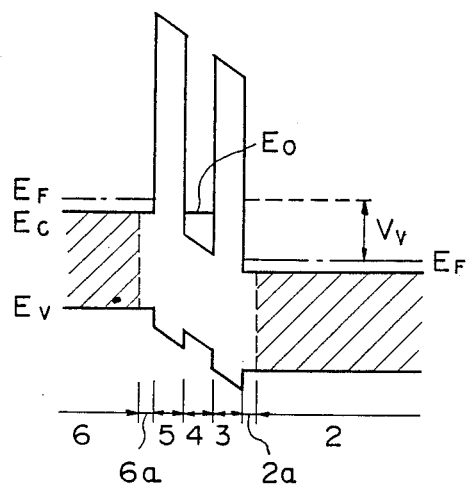
FIG. 8A is a schematic energy band diagram of the RTB structure device of FIG. 1 at a valley voltage.
Figure 8B:
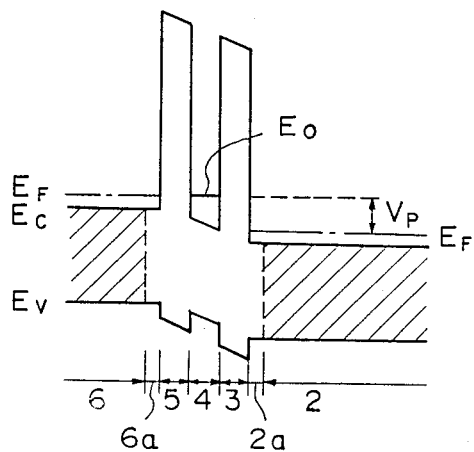
FIG. 8B is a schematic energy band diagram of the RTB structure device of FIG. 1 at a peak voltage.

When a voltage is applied across the metal electrodes 7, 8 and is increased, a current-voltage characteristic (negative differential resistance characteristic) of the RTB structure diode is obtained, as shown in FIG. 7. In the drawing, a curved line has a peak point P and a valley point V. As the applied voltage is increased, the current (or current density) is first increased to a maximum value (peak current Ip or Jp) at a peak voltage Vp, and then decreased to a minimum value (valley current Iv or Jv) at a valley voltage Vv. For a voltage larger than Vv, the current is increased exponentially to the voltage. The condition energy-band diagram of the RTB structure under bias conditions at points V and P are shown in FIGS. 8A and 8B, respectively. In these drawings, "Eo" indicates a first resonant level for the electron in the wall layer 4.

EXAMPLE 1

The RTB structure diode of FIG. 1 was formed of the following parts:

| | |
|---|---|
| InP substrate 1 | $n^+$-type, (100) |
| | about 500 $\mu$m thickness |
| Contact layer 9 | $n^+$-type $In_{0.53}Ga_{0.47}As$ |
| | 0.3 $\mu$m thickness |
| | Si dopant of $1 \times 10^{19}$ cm$^{-3}$ |
| Doped layer 5 | $n^+$-type $In_{0.53}Ga_{0.47}As$ |
| | 0.2 $\mu$m thickness |
| | Si dopant of $1 \times 10^{18}$ cm$^{-3}$ |
| Spacer layer 5a | i-type (undoped) $In_{0.53}Ga_{0.47}As$ |
| | 1.5 nm thickness |
| Barrier layer 2 | i-type $AlAs_{0.56}Sb_{0.44}$ |
| | 2.3 nm thickness |
| Well layer 4 | i-type $In_{0.53}Ga_{0.47}As$ |
| | 4.4 nm thickness |
| Barrier layer 3 | i-type $AlAs_{0.56}Sb_{0.44}$ |
| | 2.3 nm thickness |
| Spacer layer 6a | i-type $In_{0.53}Ga_{0.47}As$ |
| | 1.5 nm thickness |
| Doped layer 6 | $n^+$-type $In_{0.53}Ga_{0.47}As$ |
| | 0.1 $\mu$m thickness |
| | Si dopant of $1 \times 10^{18}$ cm$^{-3}$ |
| Contact layer 10 | $n^+$-type $In_{0.53}Ga_{0.47}As$ |
| | 0.1 $\mu$m thickness |
| | Si dopant of $2 \times 10^{19}$ cm$^{-3}$ |
| Electrodes 7 and 8 | Au |
| | 0.4 $\mu$m thickness |
| Protective layer 11 | $SiO_2$ |
| | 0.3 $\mu$m thickness |

In this case, the well layer 3, doped layers 5 and 6, and contact layers 9 and 10 were lattice-matched to InP, and the barrier layers was made of $AlAs_{0.56}Sb_{0.44}$, which was selected from $Al_xGa_{1-x}As_ySb_{1-y}$ ($0 \leq x \leq 1$, $y = 0.56 + 0.05x$) for lattice-matching to InP.

The obtained RTB structure diode was tested at room temperature to obtain the current-voltage characteristics. The diode had a peak current density Jp of $10^4$ A/cm$^2$ and a peak-to-valley current density ratio Jp/Jv of 10 or more.

EXAMPLE 2

Another RTB structure diode having a structure shown in FIG. 5 was formed of the following parts. Note, the difference of Example 2 from Example 1 is a change of the $In_{0.53}Ga_{0.47}As$ of the well layer, doped layers, spacer layers, and contact layers to InP.

| | |
|---|---|
| InP substrate 1 | $n^+$-type, (100) |
| | about 500 $\mu$m thickness |
| Contact layer 9 | $n^+$-type InP |
| | 0.3 $\mu$m thickness |
| | Si dopant of $1 \times 10^{19}$ cm$^{-3}$ |
| Doped layer 5 | $n^+$-type InP |
| | 0.2 $\mu$m thickness |
| | Si dopant of $1 \times 10^{18}$ cm$^{-3}$ |
| Spacer layer 5a | i-type (undoped) InP |
| | 1.5 nm thickness |
| Barrier layer 2 | i-type $AlAs_{0.56}Sb_{0.44}$ |
| | 2.3 nm thickness |
| Well layer 4 | i-type InP |
| | 3.8 nm thickness |
| Barrier layer 3 | i-type $AlAs_{0.56}Sb_{0.44}$ |
| | 2.3 nm thickness |
| Spacer layer 6a | i-type InP |
| | 1.5 nm thickness |
| Doped layer 6 | $n^+$-type InP |
| | 0.1 $\mu$m thickness |
| | Si dopant of $1 \times 10^{18}$ cm$^{-3}$ |
| Contact layer 10 | $n^+$-type InP |
| | 0.1 $\mu$m thickness |
| | Si dopant of $2 \times 10^{19}$ cm$^{-3}$ |
| Electrodes 7 and 8 | Au |
| | 0.4 $\mu$m thickness |
| Protective layer 11 | $SiO_2$ |
| | 0.3 $\mu$m thickness |

The obtained RTB structure diode at room temperature had a peak current density Jp of 10 A/cm$^2$ and a Jp/Jv of 10 or more.

The RTB structure lattice-matched to InP according to the present invention obtained a Jp/Jv ratio of 10 or more at room temperature, which is about twice as large as that of a conventional RTB structure of the lattice-match type. The RTB structure having such a good negative differential resistance characteristics can be used between an emitter and a base of a hot electron transistor (HET) to form a RHET. Such a RHET is described in U.S. Pat. No. 4,712,121.

When $GaAs_{0.51}Sb_{0.49}$ ($x = 0$) is adopted for the barrier layer of $Al_xGa_{1-x}As_ySb_{1-y}$, the obtained RTB structure has characteristics similar to those of a conventional RTB structure of a lattice-match type. But, Al is not used, and this brings an advantage in that the RTB structure can be produced by mass-production methods such as the MBE method using gas sources, and the MOCVD method.

It will be obvious that the present invention is not restricted to the above-mentioned embodiments and that many variations are possible for persons skilled in the art without departing from the scope of the invention. For example, although the above-mentioned quantum-well structure has a symmetrical structure in which the composition (i.e., barrier height) and the thickness (i.e., barrier width) of the barrier layers are the same, it is possible to adopt an asymmetrical structure in which the composition and/or the thickness of one of the barrier layers are different from the other barrier layer.

We claim:
1. A resonant tunnelling barrier structure device comprising:
an InP substrate; and a resonant tunnelling barrier structure formed on said InP substrate and consisting of at least two barrier layers of $Al_xGa_{1-x}As_ySb_{1-y}$ ($0 \leq x \leq 1$, $y = 0.51 + 0.05x$), at least one well layer of InP or $In_zGa_{1-z}As$ ($0.52 \leq z \leq 0.54$) sandwiched between said barrier layers, and two doped layers of InP or $In_zGa_{1-z}As$ holding all of said barrier layers and said well layer therebetween, said barrier layers, well layers and doped layers being lattice-matched to InP of said substrate.

2. A device according to claim 1, wherein the mole fraction "x" of said barrier layers is from 0.35 to 1.

3. A device according to claim 1, wherein said resonant tunnelling barrier structure further comprises two undoped spacer layers of InP or $In_zGa_{1-z}As$, each of said layers being formed between said doped layers and said barrier layers, respectively.

4. A resonant tunnelling barrier structure device comprising:

an InP substrate;

a first doped layer of InP or $In_zGa_{1-z}As$ ($0.52 \leq z \leq 0.54$) formed on said InP substrate and lattice-matched to InP;

a first barrier layer of $Al_xGa_{1-x}As_ySb_{1-y}$ ($0 \leq x \leq 1$, $y = 0.51 + 0.05x$) formed on said first doped layer and lattice-matched to InP;

a well layer of InP or $In_zGa_{1-z}As$ formed on said first barrier layer and lattice-matched to InP;

a second barrier layer of $Al_xGa_{1-x}As_ySb_{1-y}$ ($0 \leq x \leq 1$, $y = 0.51 + 0.05x$) formed on said well layer and lattice-matched to InP; and a second doped layer of InP or $In_zGa_{1-z}As$ formed on said second barrier layer and lattice-matched to InP.

5. A device according to claim 4, wherein the mole fraction "x" of said first and second barrier layers is from 0.35 to 1.

6. A device according to claim 4, further comprising a first undoped spacer layer of InP or $In_zGa_{1-z}As$ formed between said first doped layer and said first barrier layer, and a second undoped spacer layer of InP or $In_zGa_{1-z}As$ formed between said second barrier layer and said second doped layer.

7. A device according to claim 4, further comprising a first contact layer of InP or $In_zGa_{1-z}As$ formed between said InP substrate and said first doped layer, a second contact layer of InP or $In_zGa_{1-z}As$ formed on said second doped layer, a first electrode formed on said first contact layer, a second electrode formed on said second contact layer, and a means for applying a voltage across said first and second electrodes.

* * * * *